US 8,433,392 B2

(12) United States Patent
Riederer

(10) Patent No.: US 8,433,392 B2
(45) Date of Patent: Apr. 30, 2013

(54) SYSTEM AND METHOD FOR MOVING TABLE MRI

(75) Inventor: Stephen J. Riederer, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 73 days.

(21) Appl. No.: 13/122,586

(22) PCT Filed: Sep. 29, 2009

(86) PCT No.: PCT/US2009/058762
§ 371 (c)(1),
(2), (4) Date: Apr. 5, 2011

(87) PCT Pub. No.: WO2010/045018
PCT Pub. Date: Apr. 22, 2010

(65) Prior Publication Data
US 2011/0184273 A1    Jul. 28, 2011

Related U.S. Application Data

(60) Provisional application No. 61/105,312, filed on Oct. 14, 2008.

(51) Int. Cl.
*A61B 5/055* (2006.01)

(52) U.S. Cl.
USPC ......... 600/420; 600/410; 600/415; 600/416; 600/419; 324/307; 324/309; 324/306

(58) Field of Classification Search .................. None
See application file for complete search history.

(56) References Cited

U.S. PATENT DOCUMENTS

| | | | |
|---|---|---|---|
| 5,928,148 A | 7/1999 | Wang et al. | |
| 6,230,040 B1 | 5/2001 | Wang et al. | |
| 6,671,536 B2 * | 12/2003 | Mistretta | 600/410 |
| 2004/0155654 A1 | 8/2004 | Brittain | |
| 2005/0020897 A1 | 1/2005 | Fuderer | |
| 2005/0030022 A1 | 2/2005 | Robb et al. | |
| 2007/0276221 A1 | 11/2007 | Warntjes | |
| 2008/0135769 A1 | 6/2008 | Rosen | |
| 2008/0137930 A1 | 6/2008 | Rosen | |

OTHER PUBLICATIONS

International Search Report as mailed on Nov. 12, 2009, in connection with PCT/US2009/058762.

* cited by examiner

*Primary Examiner* — Long V. Le
*Assistant Examiner* — Farshad Negarestan
(74) *Attorney, Agent, or Firm* — Quarles & Brady, LLP

(57) ABSTRACT

The present invention provides an MRI system for imaging of a subject over extended field-of-view (FOV) that employs both accelerated data acquisition, which is employed while the subject is stationary, and traditional data acquisition, which is employed while the subject is moved through the MRI system. This approach provides improved spatial resolution and time efficiency compared to traditional extended FOV imaging techniques.

15 Claims, 4 Drawing Sheets

SYSTEM AND METHOD FOR MOVING TABLE MRI

CROSS-REFERENCE TO RELATED APPLICATIONS

This application is based on, claims the benefit of, and herein incorporates by reference in their entirety, PCT International Application PCT/US2009/058762 filed on Sep. 29, 2009 and U.S. Provisional Patent Application Ser. No. 61/105,312 filed on Oct. 14, 2008, and entitled "SYSTEM AND METHOD FOR MOVING TABLE MRI."

STATEMENT REGARDING FEDERALLY SPONSORED RESEARCH

This invention was made with government support under EB000212 awarded by the National Institute of Biomedical Imaging and Bioengineering. The government has certain rights in this invention.

BACKGROUND OF THE INVENTION

The field of the invention is magnetic resonance imaging ("MRI") methods and systems. More particularly, the invention relates to the imaging of a subject having an extended field-of-view (FOV) that exceeds the defined FOV of the MRI system using accelerated imaging techniques to yield improved time efficiency.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient (Gy) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Magnetic resonance angiography (MRA) uses the magnetic resonance phenomenon to produce images of the human vasculature. To enhance the diagnostic capability of MRA a contrast agent such as gadolinium can be injected into the patient prior to the MRA scan. It is advantageous in contrast enhanced (CE) MRA methods to acquire the central k-space views at the moment the bolus of contrast agent is flowing through the vasculature of interest. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as, for example, 6 seconds.

The short separation time between arterial and venous enhancement dictates the use of acquisition sequences of either low spatial resolution or very short repetition times (TR). Short TR acquisition sequences severely limit the signal-to-noise ratio (SNR) of the acquired images relative to those exams in which longer TRs are possible. The rapid acquisitions required by first pass CEMRA methods thus impose an upper limit on either spatial or temporal resolution. One way to address these short arterial-to-venous imaging windows is the use of an elliptical centric view order in which the k-space samples close to the origin of k-space which dictate the overall image appearance are acquired during the peak-arterial and pre-venous phase.

It is helpful in many applications where proper timing is difficult to acquire a series of MRA image frames in a dynamic study that depicts the separate enhancement of arteries and veins. Such temporal series of image frames is also useful for observing delayed vessel filling patterns caused by disease. This requirement has been partially addressed by acquiring a series of time resolved images using a 3D "Fourier" acquisition as described by Korosec F., Frayne R, Grist T, Mistretta C., "Time-Resolved Contrast-Enhanced 3D MR Angiography", *Magn. Reson. Med.* 1996; 36:345-351 and in U.S. Pat. No. 5,713,358. When a dynamic study is performed, the time resolution of the study is determined by how fast the k-space data can be acquired for each image frame. This time resolution objective is often compromised in order to acquire all the k-space data needed to produce image frames of a prescribed resolution without undersampling artifacts. A particularly useful technique to increase the frame rate of time-resolved sequences while maintaining spatial resolution is the method of view sharing, as described by Riederer in U.S. Pat. No. 4,830,012.

Efforts have been made to acquire CEMRA images in shorter scan times using undersampled projection reconstruction scanning methods. As described in U.S. Pat. No. 6,487,435, it was discovered that image artifacts due to k-space undersampling may be distributed in space and less objectionable when radial acquisitions are used. This is particularly true of CEMRA image frames in which a pre-contrast mask image is subtracted from each acquired image frame.

Depending on the technique used, many MR scans currently used to produce medical images require many minutes to acquire the necessary data. The reduction of this scan time is an important consideration, since reduced scan time also increases patient throughout, improves patient comfort, and improves image quality by reducing motion artifacts. Many different strategies have been developed to shorten the scan time.

One such strategy is referred to generally as "parallel imaging." Parallel imaging techniques use spatial information from arrays of RF receiver coils to substitute for the encoding that would otherwise have to be obtained in a sequential fashion using RF pulses and field gradients, such as phase and frequency encoding. Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for a given image, in comparison to conventional k-space data acquisition, by a factor that in the most favorable case equals the number of the receiver coils. Thus, the use of multiple receiver coils acts to multiply imaging speed, without increasing gradient switching rates or RF power.

Two categories of such parallel imaging techniques that have been developed and applied to in vivo imaging are SENSitivity Encoding (SENSE) and SiMultaneous Acquisition of Spatial Harmonics (SMASH). With SENSE, the undersampled k-space data is first Fourier transformed to produce an aliased image from each coil, and then the aliased image signals are unfolded by a linear transformation of the superimposed pixel values. SENSE has been further extended to parallel acquisition along the two phase encode directions when 3DFT acquisition is used. With SMASH, the omitted k-space lines are filled in or reconstructed prior to Fourier transformation, by constructing a weighted combination of neighboring lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as GeneRalized Autocalibrating Partially Parallel Acquisitions (GRAPPA), introduced by Griswold et al. This technique is described in U.S. Pat. No. 6,841,998 as well as in the article entitled "Generalized Autocalibrating Partially Parallel Acquisitions (GRAPPA)," by Griswold et al. and published in *Magnetic Resonance in Medicine* 47:1202-1210 (2002). Using these GRAPPA techniques, lines near the center of k-space are sampled at the Nyquist frequency, in comparison to the greater spaced lines at the edges of k-space. These so-called autocalibration signal (ACS) lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

It is often desirable to perform MRI over a region of a subject that exceeds the longitudinal field-of-view (FOV) of the MRI system. For example, CEMRA studies of the peripheral vasculature, in which an intravenously administered contrast agent is imaged as it passes through the vasculature from the level of the renal arteries to the feet, generally have a longitudinal FOV that exceeds 100 cm.

A common technique for performing MRI studies over extended FOVs is multi-station imaging, which involves placing a subject on the patient table of an MRI system and moving the patient table to acquire NMR data from the subject at multiple positions, or "stations". For example, in a three station CEMRA study of the peripheral vasculature of a subject, these stations are generally positioned at the level of the renal artery origins, the level of the thighs, for imaging the femoral arteries, and the level of the lower legs, for imaging the popliteal arteries and their trifurcations. Complete images are acquired at each station but data acquisition is not performed when the table is moved from station to station.

Another method for performing extended FOV MRI is the continuously moving table (CMT) technique. This technique uses a continuously moving table during imaging and "stitching" together the acquired NMR data to form a single composite image of a subject over the extended FOV. The CMT technique may be further enhanced using time-resolved imaging, variable table velocity, and adjustable spatial resolution.

Both multi-station and CMT acquisition techniques have significant drawbacks. For example, in multi-station acquisition there are periods of lost data acquisition when the patient table is moved from station to station. For both techniques, the spatial resolution of the acquired MR images is restricted by the limited timeframe during which a given longitudinal level is contained within an advancing FOV, generally on the order of 20 seconds. This issue has been addressed for multi-station acquisition, where accelerated data imaging, for example, SENSE or GRAPPA, is used to reduce the acquisition time by approximately a factor of ten. However, the need to measure sensitivity profiles of the receiver coils and the nonlinear mapping of the imaging gradients prohibits the efficient use of accelerated imaging during CMT acquisition.

It would therefore be desirable to develop a system and method for performing extended FOV MRI that yields improved time efficiency in data acquisition and the implementation of accelerated imaging.

SUMMARY OF THE INVENTION

The present invention overcomes the aforementioned drawbacks by providing a magnetic resonance imaging (MRI) system having a defined field-of-view (FOV) and using a method for performing imaging over an extended FOV that advantageously interleaves multi-station and CMT techniques to provide periods for the efficient application of accelerated imaging, while allowing accurate bolus tracking.

In accordance with one aspect of the present invention, a method of imaging a subject with an MRI system is disclosed that includes determining a set of positions, or stations, at which to image a subject over an extended FOV and performing a prescan at the predetermined stations to determine the sensitivity profiles of the receiver coil elements that will be operative at each predetermined station. The method also includes moving the subject to the first predetermined station and performing a stationary scan to acquire NMR data from the subject at the predetermined station, where the stationary scan includes using the previously acquired sensitivity profiles to perform accelerated data acquisition. In addition, the method includes performing an intermediate scan to acquire NMR data from the subject while moving the subject to a next predetermined station, repeating the stationary and intermediate scanning steps until NMR data from the subject has been acquired at all predetermined stations, and reconstructing and processing the acquired NMR data.

In accordance with another aspect of the present invention, the intermediate scans do not employ accelerated data acquisition. This can be accounted for by employing specific phase encoding during the intermediate scans.

In accordance with another aspect of the present invention, reconstruction and processing includes registering the data acquired during each stationary and intermediate scan. The registered data may be used to provide improved spatial resolution for images acquired during the intermediate scans or it may allow images for several timeframes to be generated.

Various other features of the present invention will be made apparent from the following detailed description and the drawings.

DETAILED DESCRIPTION OF THE INVENTION

Figure 1:
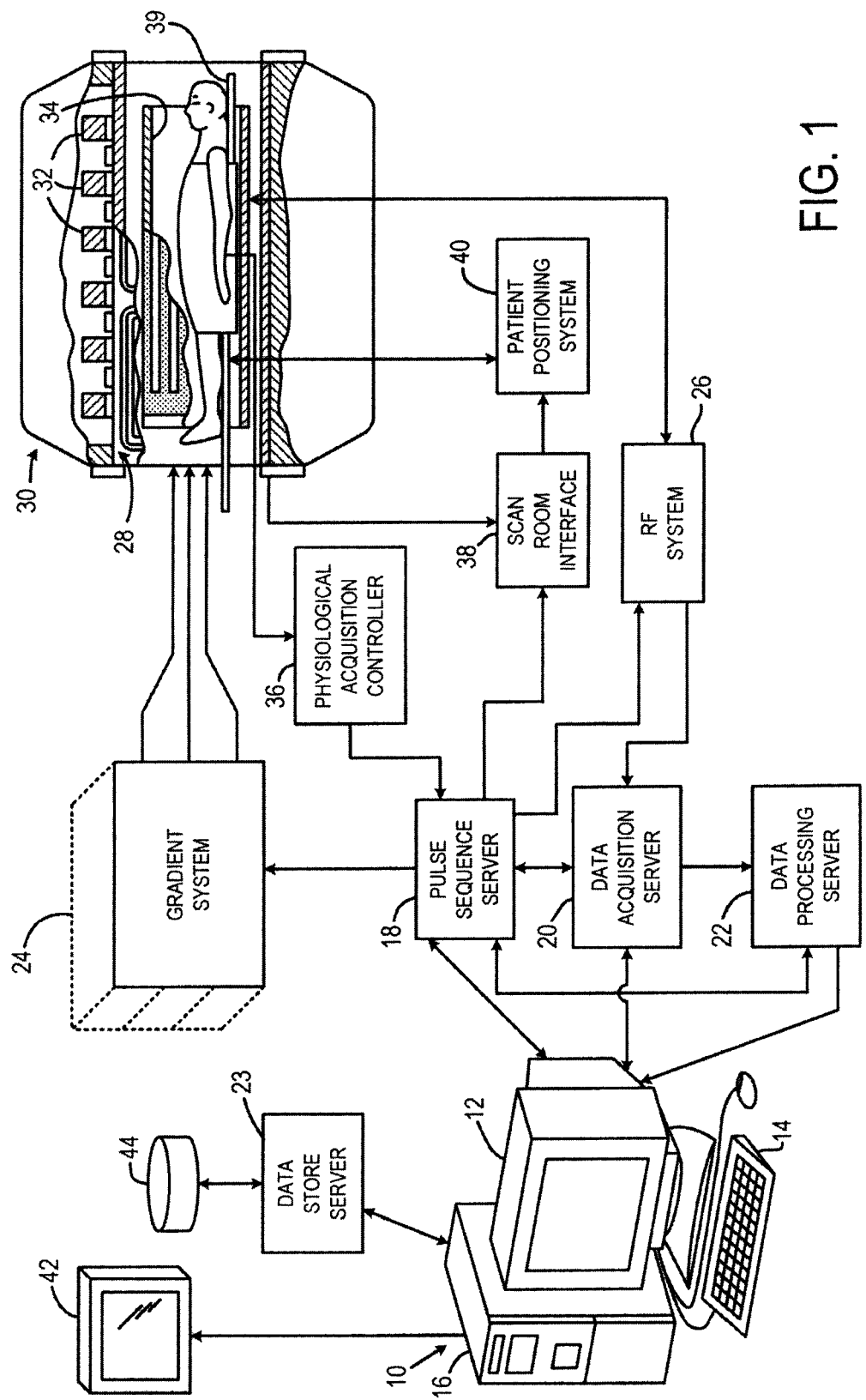
FIG. 1 is a block diagram of an MRI system that employs the present invention.

Referring to FIG. 1, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

The RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1} Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient table 39 to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
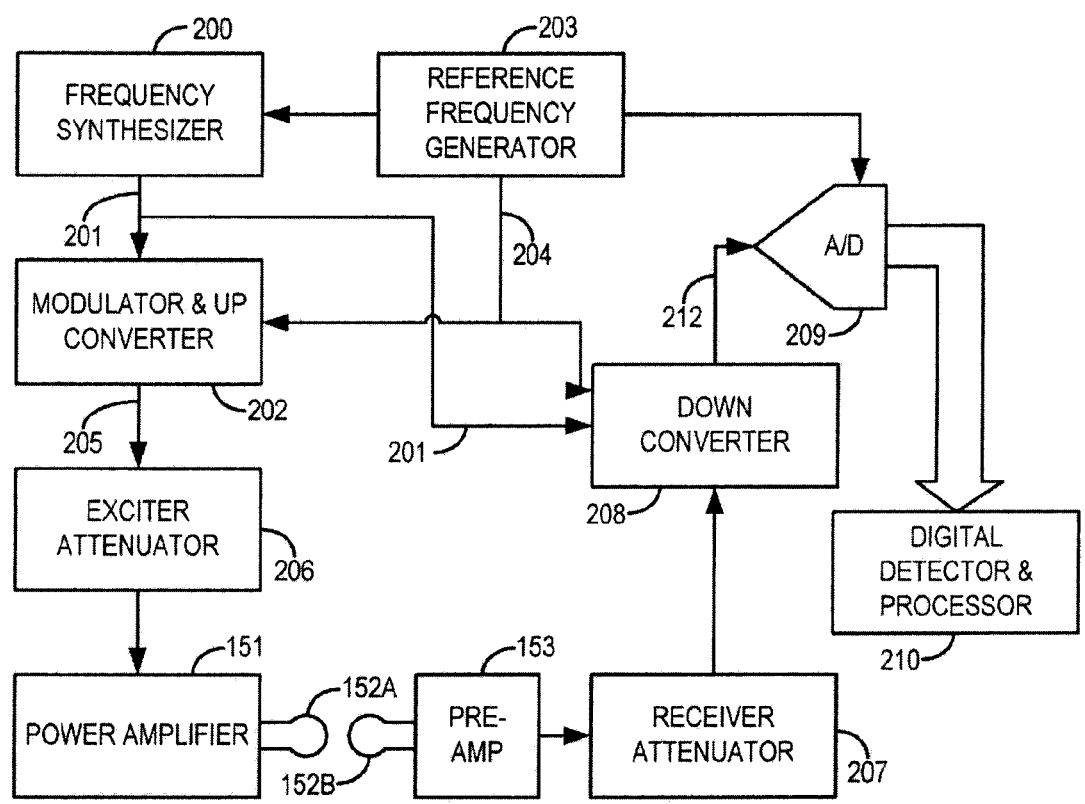
FIG. 2 is a block diagram of an RF system that forms part of the MRI system of FIG. 1.

As shown in FIG. 1, the RF system 26 may be connected to the whole body RF coil 34, or as shown in FIG. 2, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring still to FIG. 2 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203.

Figure 3:
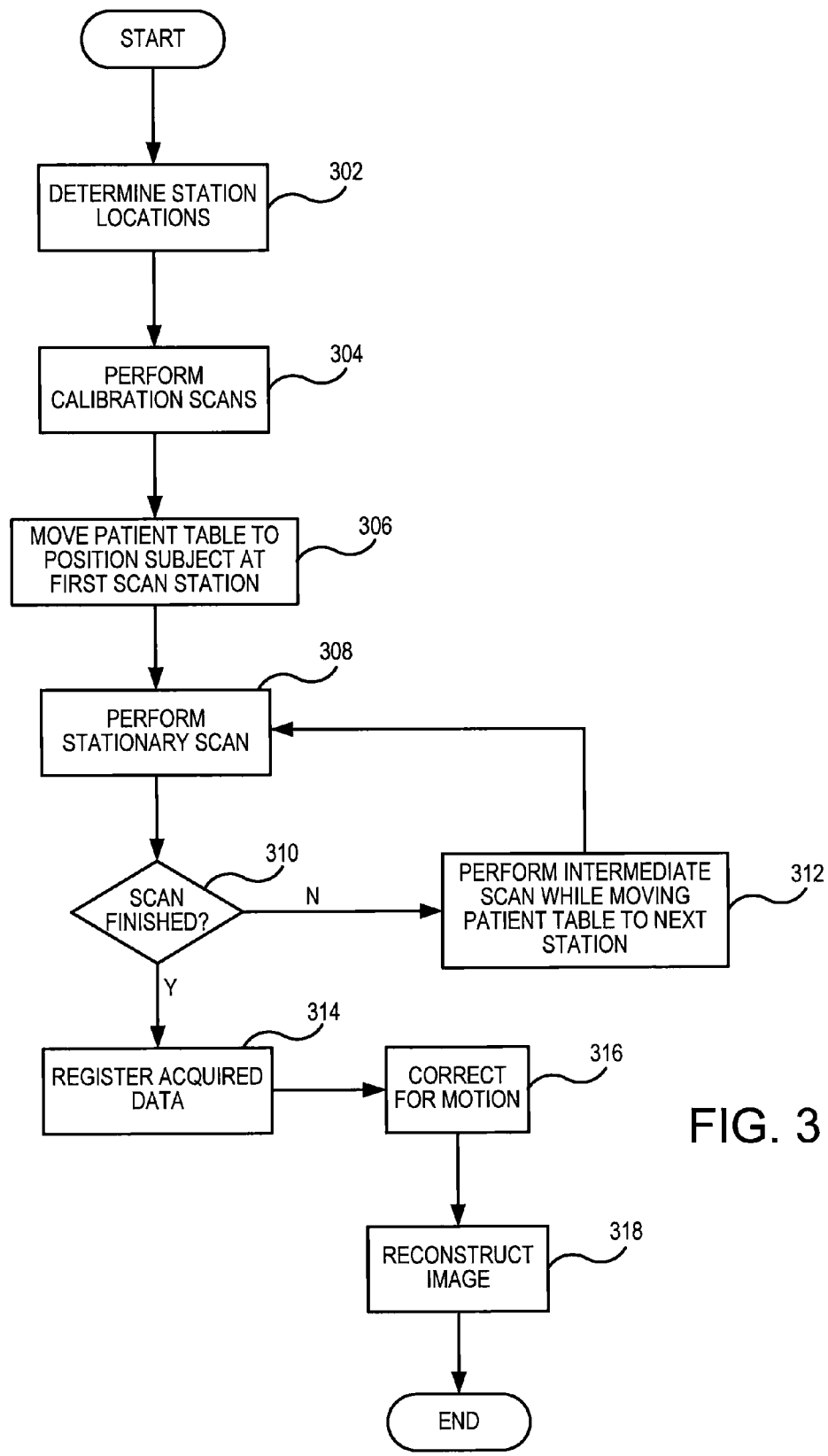
FIG. 3 is a flowchart setting forth the steps for an extended FOV MRI technique in accordance with the present invention to be performed using the MRI system of FIG. 1.

Referring to FIGS. 1 and 3, the present invention uses the MRI system of FIG. 1, particularly the patient positioning system 40 and patient table 39, to perform extended FOV MRI scans. The process commences and, at process block 302, a set of specific table positions, or stations, are determined. It is contemplated that three to six stations may be used to perform a CEMRA study of the peripheral vasculature of a subject. Then, at process block 304, a separate calibration scan is performed at each station to determine the sensitivity profiles of the receiver coil elements that will be operative at each phase of the scan. These profiles are used in the unfolding portion of the reconstruction of data acquired using accelerated imaging. At process block 306, a subject, that in the case of CEMRA has been administered a contrast enhancing agent, is moved on the patient table 39 to the first predetermined station and, at process block 308, a stationary scan is performed using accelerated imaging, for example, using the above-described SENSE or GRAPPA techniques. The stationary scan is performed for a predetermined period of time or until a selected tracking feature, for example, the leading edge of a contrast agent bolus, approaches the distal end of the FOV. In this case, the selected feature is identified and tracked by generating and analyzing real-time reconstructions of scan data.

Immediately following the stationary scan, at process block 312, the patient table 39 is moved toward the next predetermined station and an intermediate scan is performed. The exact position and velocity of the patient table 39 are recorded by the patient positioning system 40. Accelerated data acquisition techniques are not used during the intermediate scan performed during table motion in order to avoid the aforementioned problems associated with the dependency of coil sensitivity profiles on varying gradient warping fields. Put another way, an acceleration factor of unity (1) is employed, such that the acquisition is substantially free of acceleration.

The lack of acceleration is accommodated by applying specific phase encoding during the intermediate scans. That is, in an accelerated scan, the phase encode order necessarily skips phase encode views that would otherwise be sampled in the unaccelerated case. The accelerated scan can be used during periods of the table being stationary. During moving period, the phase encode order reverts to that of the unaccelerated case. In this situation virtually any phase encode order can be used, such as sequential, elliptical centric, or some alternative.

Referring still to FIGS. 1 and 3, the patient table 39 stops moving when it reaches the next predetermined station. At this time, the intermediate scan ends and another stationary scan, employing accelerated imaging, is performed at process block 308. Again, the stationary scan continues for a predetermined period of time or until a selected feature approaches the distal end of the FOV. Again, the stationary scan is performed for a predetermined period of time or until a selected feature, for example, the leading edge of a contrast agent bolus, approaches the distal end of the FOV. Thereafter, the table is moved to the next predetermined station and an another intermediate scan is performed during table motion at process block 312.

These stationary and intermediate scanning periods are performed repeatedly until, at decision block 310, it is determined that the scan is complete and MR data has been acquired at all predetermined stations. Following acquisition, the MR data is processed and reconstructed. Specifically, the MR data acquired during each scanning period is registered at process block 314 and correcting for motion errors caused by patient table acceleration and deceleration during the intermediate scans using exact knowledge of patient table position and velocity at process block 316.

Registration is performed using a combination of sub-pixel and integral-pixel shift corrections to allow data acquired during stationary scans to be shared and provide intermediate scans with improved spatial resolution. It is contemplated that both fine (sub-pixel) and coarse (multiple pixel) corrections are performed based on knowledge of the table position. Acceleration is accounted for by modeling how velocity does not change instantaneously or by direct measurement of the table position using a position encoder. It is further contemplated these techniques can be used to generate images for several timeframes during the intermediate scans. View sharing methods can be used in which the central views of k-space are measured more frequently than the peripheral k-space views, and from one image to the next the central views and only some portion of the peripheral views are updated.

Thereafter, image reconstruction of moving table data can proceed with standard Fourier transformation after the shifts between data are accounted for due to the table position possibly being different for each repetition of the acquisition. Once image reconstruction is performed, at process block 318, the images can then be subjected to additional processing, if desired.

Figure 4:
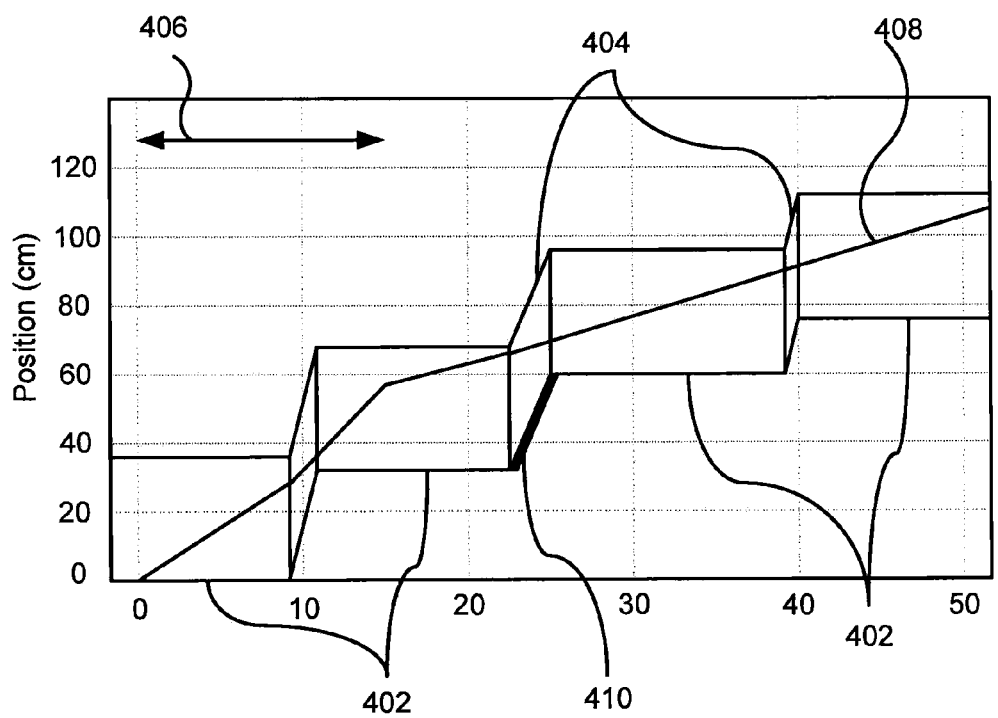
FIG. 4 is schematic that depicts a scanning coverage provided by one application of the present invention.

Referring to FIG. 4, the scanning coverage of one aspect of the present invention, which is designed for a peripheral CEMRA study of a subject having been administered a contrast-enhancing agent, is shown. Data acquisition is performed using a combination of moderately long, for example, approximately 9 seconds, stationary phases 402, during which the table is held at a fixed position, and intermediate phases 404, during which the table is moved from station to station. Accelerated imaging techniques are implemented to lower the desired acquisition time 406, such as, the acquisition time necessary to attain a desired spatial resolution, to approximately 15 seconds. This is compared to the approximately 20-25 seconds needed using traditional techniques. The leading edge of the advancing bolus 408 is maintained within the active FOV. That is, the FOVs of the stationary and intermediate scans, 402 and 404 respectively, is maintained within the active FOV for the duration of the scan. Moreover, the extent of inadequate sampling 410, which is due to inadequate data acquisition time and thus provides inadequate spatial resolution, is greatly reduced compared to traditional methods.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

The invention claimed is:

1. A method for producing an image over an extended field-of-view (FOV) of a magnetic resonance imaging (MRI) system having a predefined FOV that is smaller than the extended FOV, the method comprising the steps of:
   a) determining a set of imaging stations at which to image a subject over the extended FOV;
   b) performing a prescan at the set of imaging stations using receiver coil elements to acquire a prescan data set;
   c) determining sensitivity profiles of the receiver coil elements at each of the set of imaging stations from the prescan data set;
   d) moving the subject to a first station in the set of imaging stations;
   e) performing a stationary, parallel imaging acquisition using the sensitivity profiles determined at step c) while the subject is at the first station to acquire a first set of NMR data from the subject;
   f) moving the subject toward a next station in the set of imaging stations;
   g) performing an intermediate imaging acquisition while the subject is being moved toward the next station in the set of imaging stations to acquire a next set of NMR data;
   h) performing a stationary, parallel imaging acquisition using the sensitivity profiles determined at step c) while the subject is at the next station to acquire a next set of NMR data from the subject;
   i) repeating steps f) through h) until the last station to acquire a series of NMR data from the subject; and
   j) a reconstructing and processing the series of NMR data to produce images of the subject over the extended FOV.

2. The method of claim 1 wherein step g) includes performing the intermediate imaging acquisition with a degree of acceleration of substantially unity.

3. The method of claim 1 wherein step i) includes performing the stationary, parallel imaging acquisition with a degree of acceleration varied at the imaging stations.

4. The method of claim 1 wherein step i) includes reconstructing real-time images and monitoring a timing and velocity of the subject during movement by analyzing the real-time images to identify a selected tracking feature.

5. The method of claim 4 wherein step h) includes reconstructing the real-time images from the first and next sets of NMR data.

6. The method of claim 4 wherein the tracking feature includes a leading edge of a contrast agent bolus administered to the subject approaching a distal end of the predefined FOV.

7. The method of claim 1 wherein step i) includes registering the series of NMR data to increase a spatial resolution during the intermediate imaging acquisition.

8. The method of claim 1 wherein step f) is performed according to a continuous moving table (CMT) technique.

9. A method for producing an image over an extended field-of-view (FOV) of a magnetic resonance imaging (MRI)

system having a predefined FOV that is smaller than the extended FOV, the method comprising the steps of:
    a) determining a plurality of imaging stations within the extended FOV at which to image a subject;
    b) performing a prescan at each of the plurality of imaging stations using a receiver coil having a plurality of elements to acquire a prescan data set;
    c) determining sensitivity profiles of the receiver coil at each of the plurality of imaging stations from the prescan data set;
    d) sequentially moving the subject through each of the plurality of imaging stations;
    e) at each of the plurality of imaging stations, performing a stationary, parallel imaging acquisition using the sensitivity profiles determined at step c) to acquire a corresponding, accelerated imaging data set;
    f) between each of the plurality of imaging stations, performing an intermediate imaging acquisition while the subject is moving to acquire a corresponding, non-accelerated imaging data set; and
    g) reconstructing the corresponding, accelerated imaging data set and, non-accelerated imaging data set to produce images of the subject over the extended FOV.

10. The method of claim 9 wherein step e) includes performing the stationary, parallel imaging acquisition with a degree of acceleration varied at each of the plurality of imaging stations.

11. The method of claim 9 wherein steps d) through f) include reconstructing real-time images and monitoring a timing and velocity of the subject during movement by analyzing the real-time images to identify a selected tracking feature.

12. The method of claim 11 wherein steps d) through f) include reconstructing the real-time images from the accelerated imaging data set and the non-accelerated imaging data set.

13. The method of claim 11 wherein the tracking feature includes a leading edge of a contrast agent bolus administered to the subject approaching a distal end of the predefined FOV.

14. The method of claim 9 wherein step g) includes registering the accelerated imaging data set and the non-accelerated imaging data set to increase a spatial resolution during the intermediate imaging acquisition.

15. The method of claim 9 wherein step d) includes performing a continuous moving table (CMT) technique between imaging stations.

* * * * *